United States Patent [19]

Sekine et al.

[11] 4,225,824

[45] Sep. 30, 1980

[54] FREQUENCY ADJUSTING CIRCUIT

[75] Inventors: Mitsuo Sekine, Tokorozawa; Sizuo Yamaguchi, Yama, Japan

[73] Assignee: Citizen Watch Co. Ltd., Tokyo, Japan

[21] Appl. No.: 915,739

[22] Filed: Jun. 15, 1978

[30] Foreign Application Priority Data

Jun. 21, 1977 [JP] Japan ................................ 52-73695

[51] Int. Cl.[3] ........................ H03K 1/17; H03K 21/30

[52] U.S. Cl. ........................................ 328/63; 328/48; 368/200

[58] Field of Search .................. 328/48, 63; 58/23 R, 58/85.5

[56] References Cited

U.S. PATENT DOCUMENTS

| | | | |
|---|---|---|---|
| 3,952,254 | 4/1976 | Kurita et al. | 328/63 |
| 3,988,886 | 11/1976 | Kashio | 58/23 R |
| 4,009,445 | 2/1977 | Hasegawa | 328/48 X |
| 4,101,838 | 7/1978 | Aihara et al. | 328/63 |
| 4,132,060 | 1/1979 | Kashio | 58/23 R |

*Primary Examiner*—John S. Heyman
*Attorney, Agent, or Firm*—Sherman & Shalloway

[57] ABSTRACT

A frequency adjusting circuit for digitally adjusting the frequency of a time reference signal consisting of a series of pulses is disclosed. The circuit function to adjust the frequency of said series of pulses by subtracting or adding a given number of pulses from or to said series of pulses for a time set beforehand every time upon receipt of a predetermined number of pulses of said time reference signal.

10 Claims, 6 Drawing Figures

SUBTRACTION

ADDITION

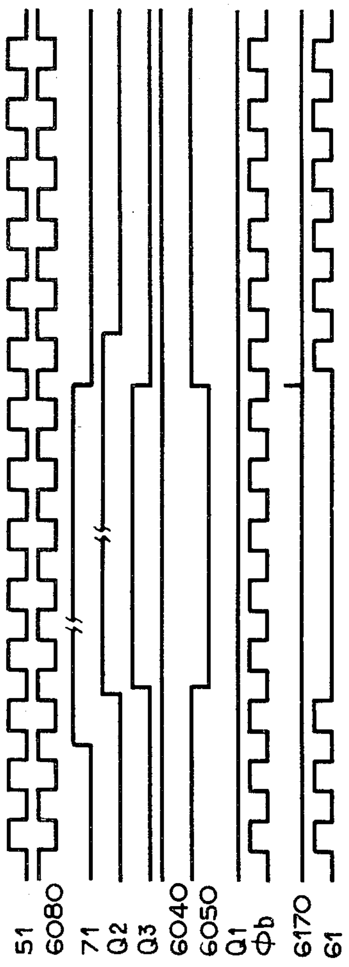
FIG. 4 (a) SUBTRACTION
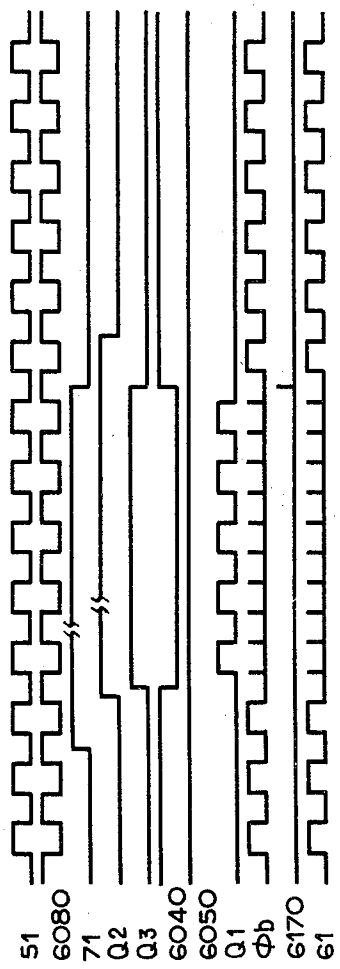
FIG. 4 (b) ADDITION

FREQUENCY ADJUSTING CIRCUIT

BACKGROUND OF THE INVENTION

1. Field of the Invention

This invention relates to a frequency adjusting circuit for digitally adjusting the frequency of a time reference signal delivered from an oscillation circuit to a given value.

2. Description of the Prior Art

Heretofore, an analog system and a digital system have been proposed as a frequency adjusting system for a quartz oscillation circuit comprising a quartz oscillator as a reference oscillator. In general, the analog system makes use of a trimmer condenser connected to the outside of an input or output of the quartz oscillation circuit and the capacity of the trimmer condenser is changed so as to adjust the frequency of output pulses delivered from the quartz oscillation circuit. As a result, in electronic devices such as an electronic time piece which is required to be small in size, there arises an important problem how to make the trimmer condenser small in size so as to make the electronic time piece as a whole small in size. In addition, the trimmer condenser gradually changes its capacity after the lapse of time irrespective of the change in the number of oscillations of the quartz oscillator per se, and as a result, the oscillation frequency becomes changed. Moreover, the capacity of the trimmer condenser considerably influences the electric power consumed by the oscillation circuit. For to the above mentioned reasons, the number of oscillations inherent the quartz oscillator must lie within a very limited range for the purpose of causing the oscillation frequency of the oscillation circuit not to deviate from the frequency desired and of operating the oscillation circuit with the least possible electric power consumed.

The conventional frequency adjusting circuit has the drawback that in the case of measuring pitches every one second, for example, if the frequency adjusting value is large, the pitch becomes changed each second, thereby rendering the measurement difficult.

SUMMARY OF THE INVENTION

An object of the invention, therefore, is to provide a frequency adjusting circuit which can digitally adjust the frequency of output pulses delivered from an oscillation circuit and which is highly precise in operation and simple in construction.

Another object of the invention is to provide a frequency adjusting circuit which can deliver a frequency adjusting instruction signal whose period is always constant, which can adjust the frequency of output pulses delivered from an oscillation circuit at the same time at every period, and which can measure the pitch in an easy manner.

A feature of the invention is the provision of a frequency adjusting circuit comprising a frequency divider for dividing the frequency of a time reference signal and generating a frequency adjusting instruction signal for determining a timing of starting the frequency adjusting operation of said time reference signal; means for adding or subtracting pulses to or from said time reference signal and adjusting the frequency of said time reference signal; a first setting means for setting said frequency adjusting means such that said frequency adjusting means can raise or lower the frequency of said time reference signal; and a second setting means for determining the time of effecting the frequency adjusting operation of said frequency adjusting means upon receipt of said frequency adjusting instruction signal.

BRIEF DESCRIPTION OF THE DRAWING

FIG. 1(*a*) is a block diagram showing a conventional frequency adjusting circuit;

FIG. 1(*b*) is a time chart showing signals at various parts of the circuit shown in FIG. 1(*a*) during the frequency adjusting operation thereof;

FIG. 4(*a*) is a time chart showing signals at various parts of the circuit shown in FIG. 3 when subtraction is effected; and FIG. 4(*b*) is a time chart showing signals at various parts of the circuit shown in FIG. 3 when addition is effected.

DETAILED DESCRIPTION OF THE INVENTION

Figures 1A, 1B, 2:
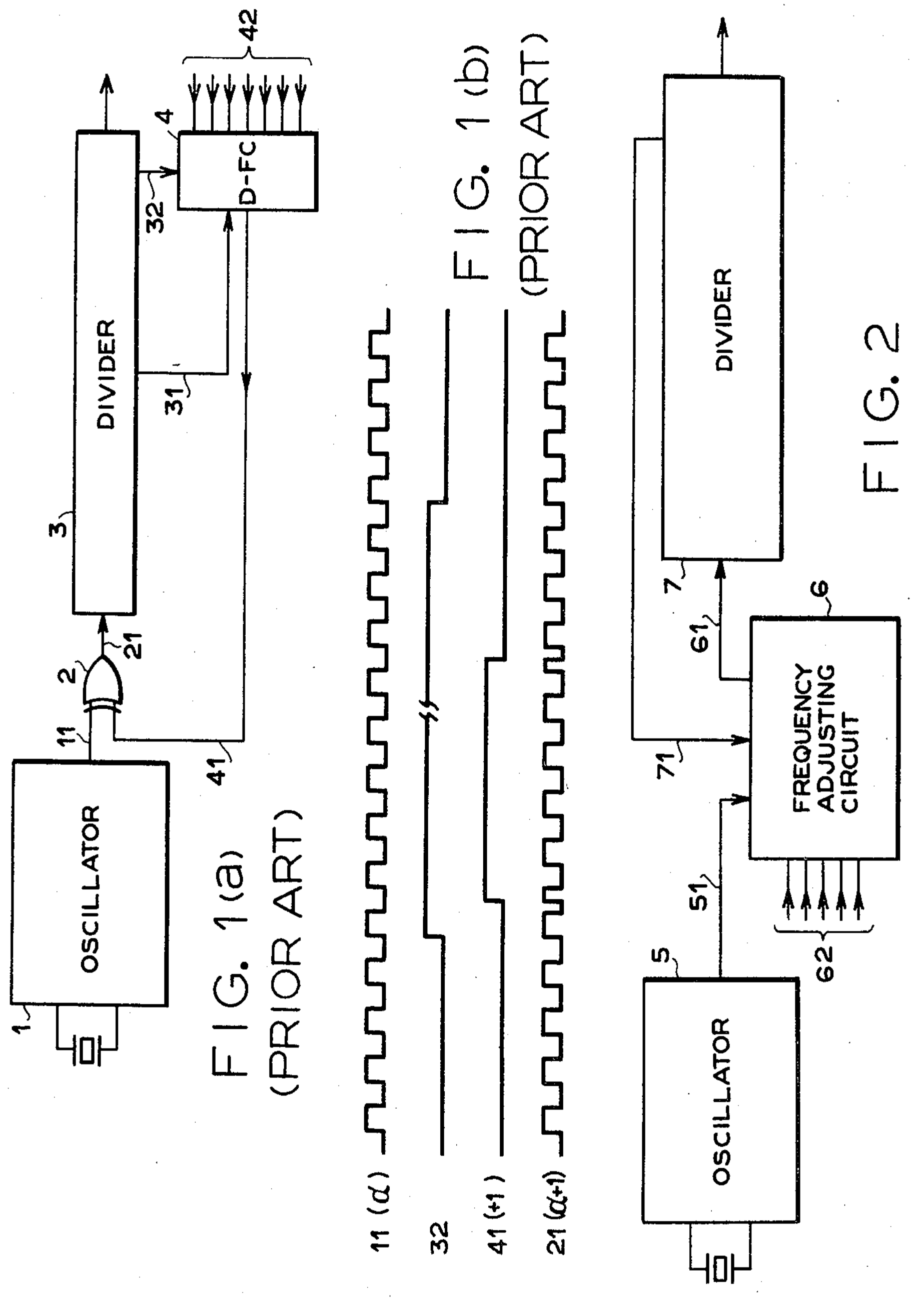
FIG. 1(a) (PRIOR ART)
FIG. 1(b) (PRIOR ART)
FIG. 2 is a block diagram showing one embodiment of a frequency adjusting circuit according to the invention.

FIG. 1(*a*) is a block diagram showing a conventional digital frequency adjusting circuit which has been proposed to digitally adjust the frequency instead of the above described analog system. The circuit includes a time reference signal generation source 1 which makes use of a quartz oscillator or the like as the reference oscillator thereof, which will hereinafter be called a quartz oscillation circuit, an Exclusive-OR gate 2, a frequency divider circuit 3 and a digital frequency adjusting circuit 4. Also shown is a reference signal 11 delivered from the quartz oscillation circuit 1, an output signal 21 delivered from the Exclusive-OR gate 2, a signal 31 for preparing a frequency adjusting signal, a frequency adjusting instruction signal 32 for effecting the frequency adjusting operation and applied to the digital frequency adjusting circuit 4, the signal 32 consisting of a plurality of signals whose periods are different from each other, a frequency adjusting signal 41 and input terminals 42 to which are applied signals for selecting one of the plurality of frequency adjusting instruction signals 32.

In the circuit shown in FIG. 1(*a*), the digital frequency adjusting circuit 4 functions to select that frequency adjusting instruction signal 32 of which period is set beforehand by the signal delivered to the input terminals 42 and delivers as its output the frequency adjusting signal 41 whose period corresponds to that of the frequency adjusting instruction signal 32. This frequency adjusting signal 41 and the reference signal 11 are applied to the Exclusive-OR gate 2 whose output signal 21 is applied to the frequency divider circuit 3.

In this case, the frequency adjusting signal 41 is lagged in phase with respect to the reference signal 11. As a result, the output 21 delivered from the Exclusive-OR gate 2 is under such condition that its pulse is the sum of the pulse of the reference signal 11 and $(+1)$ pulse. That is, let the pulse of the reference signal 11 be $\alpha$, then the number of pulses of the output 21 delivered from the Exlusive-OR gate 2 becomes $(\alpha+1)$. This condition is shown in FIG. 1(1).

In this digital system, there is generated the frequency adjusting signal 41 corresponding to the period of the frequency adjusting instruction signal 32 set beforehand at the input terminal 42. As a result, if the frequency adjusting range is made wide and a precise frequency adjusting operation must be effected, the period of the frequency adjusting instruction signal 32 is required to be considerably short. Thus, the digital frequency adjusting circuit tends to be rendered complex in construction.

FIG. 2 is a block diagram showing one embodiment of a frequency adjusting circuit according to the invention.

Referring to FIG. 2, the circuit according to this invention includes a quartz oscillation circuit 5 including a reference oscillator consisting of a quartz oscillator or the like, a frequency adjusting circuit 6 and a frequency divider circuit 7. Also shown is a frequency adjusting signal 61, and input terminal 62 of the frequency adjusting circuit 6 for receiving input signals whose frequencies are adjusted and a frequency adjusting instruction signal 71.

The present embodiment shown in FIG. 2 will operate as follows. The frequency adjusting instruction signal 71 delivered from the frequency divider circuit 7 is applied to the frequency adjusting circuit 6. As a result, the frequency adjusting circuit 6 functions to add a pulse having a value corresponding to the predetermined input terminal 62 to the reference signal 51 or subtract said pulse from the predetermined input terminal 62, thereby applying the frequency adjusted signal 61 to the frequency divider circuit 7.

Figure 3:
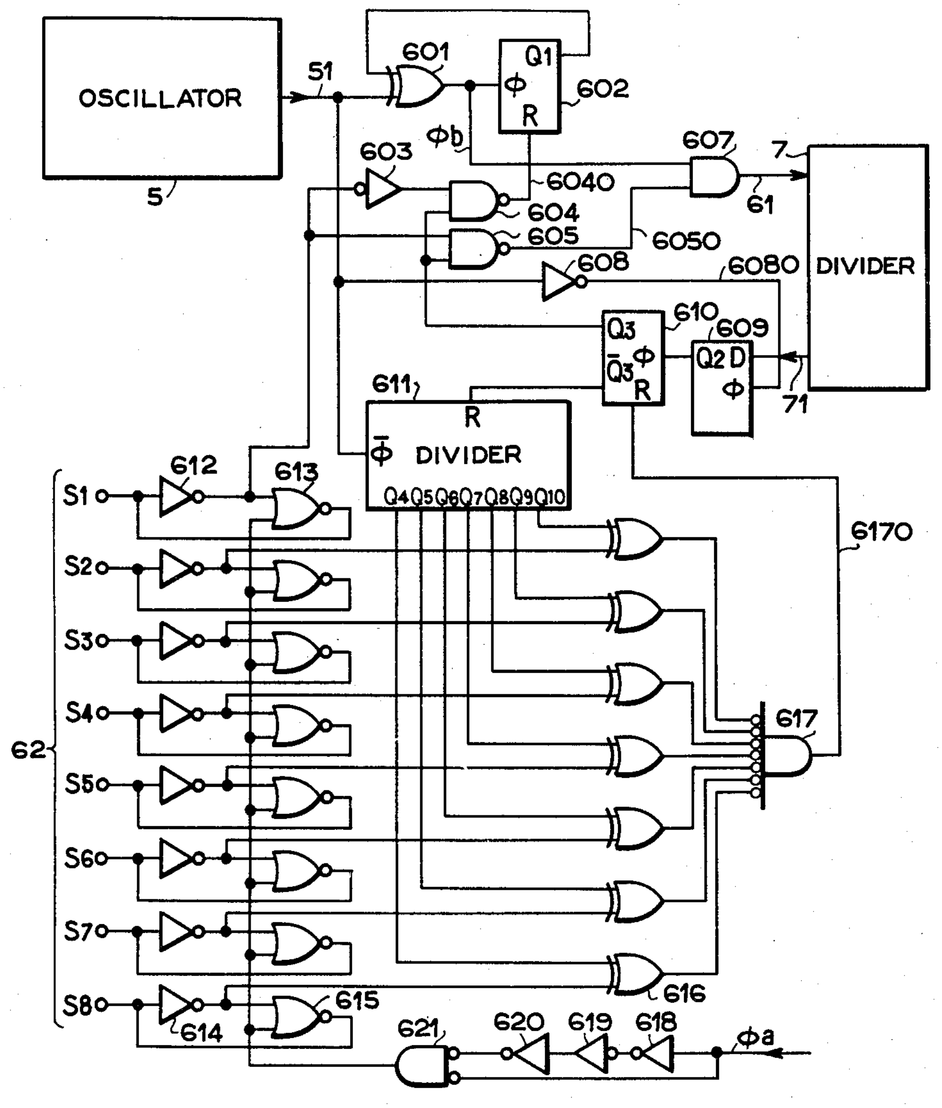
FIG. 3 is a block diagram showing in greater detail the frequency adjusting circuit shown in FIG. 2.

FIG. 3 shows one embodiment of a digital frequency adjusting circuit according to the invention. In the circuit shown in FIG. 3, the input terminal construction consisting of an input terminal 62, inverters 618, 619, 620 and an input NOR gate 621 is an input terminal having a memory effect and generally used in electronic time pieces. One of the input terminals 62, for example, an input terminal $S_1$ will now be described. The input terminal $S_1$ is connected to a time piece substrate or becomes open. In the case of the electronic time piece, a high potential is usually used as ground potential. If the input terminal $S_1$ is connected to the time piece substrate, the potential of the output from an inverter 612 becomes low, while if the input terminal $S_1$ is made open, the output delivered from the NOR gate 621 functions to make the potential of the output from a NOR gate 613 low and make the potential of the output from the inverter high. Such relation is similarly maintained by the input terminals $S_2$ to $S_8$.

The invention causes the input terminal $S_1$ to determine addition or substraction and causes the input terminals $S_2$ to $S_8$ to determine the frequency adjusting value. In the input terminals $S_1$ to $S_8$, use may be made of a non-volatile memory. The invention makes use of 8 input terminals $S_1$ to $S_8$. The number of these input terminals is not limited to 8, but any number may be selected depending upon the number of oscillations inherent to the quartz oscillator whose frequency is to be adjusted.

In FIG. 3, let toggle flipflops 602, 610 and a D type flipflop 609 be triggered by a raising up portion of a signal applied to respective inputs $\phi$ of these flipflops and let a frequency divider 611 be triggered by a lowering down portion of a signal applied to its input $\overline{\phi}$. The toggle flipflops 602, 610 and frequency divider 611 are reset during a high potential region of each of signals applied to reset inputs R of these flipflops and frequency divider. For the sake of description, let all of the potential of the outputs $Q_1$ to $Q_{10}$ of the flipflops 602, 609 and frequency divider 611 be low and the potential of the output $\overline{Q}_3$ of the toggle flipflop 610 be high.

The frequency adjusting instruction signal 71 is supplied from the frequency divider circuit 7 to an input D of the D type flipflop 609. If the potential of the frequency adjusting instruction signal 71 is changed from low to high, the D type flipflop 609 is triggered by a signal 6080 inverted from the reference signal 51 by an inverter 608. This is effected for the purpose of correcting the time delay of the frequency adjusting instruction signal 71 with respect to the reference signal 51 and hence of positively effecting the digital frequency adjusting operation. If the D type flipflop 609 is triggered by the raising up portion of the output signal 6080 delivered from the inverter 608, the potential of the output $Q_2$ of the D type flipflop 609 is changed from low to high, thereby triggering the toggle flipflop 610. As a result, the potential of the output $Q_3$ from the toggle flipflop 610 is changed from low to high, while the potential of the output $\overline{Q}_3$ of the toggle flipflop 610 is changed from high to low. As a result, the frequency adjusting operation is started.

Since the potential of a reset input R of the frequency divider 611 is changed from high to low, the reference signal 51 causes the frequency divider 611 to start its operation. Then, the frequency divider 611 operates up to the frequency adjusting values set beforehand by the input terminals $S_2$ to $S_8$. The outputs $Q_4$ to $Q_{10}$ of the frequency divider 611 are applied to one of the inputs of respective EX-OR gates 616. To the other inputs of these EX-OR gates 616 are applied the outputs delivered from inverters 614 corresponding to the input terminals $S_2$ to $S_8$. If the outputs $Q_4$ to $Q_{10}$ of the frequency divider 611 become equal in value to the outputs delivered from the inverters 614 corresponding to the input terminals $S_2$ to $S_8$, the potential of the outputs delivered from all the EX-OR gates 616 becomes low. As a result, the potential of the output 6170 from a 7-input NOR gate 617 becomes high so as to reset the toggle flipflop 610. Since the potential of the output $Q_3$ of the toggle flipflop 610 is low and the potential of the output $\overline{Q}_3$ thereof is high, the frequency divider 611 is also reset.

For example, if the input terminals $S_2$ to $S_7$ are connected to the time piece substrate, the potential of those inverters 614 which correspond to these input terminals $S_2$ to $S_7$ become low. In this case, the potential of all the outputs delivered from those EX-OR gates 616 which correspond to the input terminals $S_2$ to $S_7$ becomes low.

If the input terminal $S_8$ only is open, the potential of the output delivered from its inverter 614 becomes high. In this case, if the above described frequency adjustment is started, the frequency divider 611 is triggered by the lowering portion of the reference signal 51, thereby changing the potential of the output $Q_4$ from low to high. As a result, the potential of the output delivered from the Exclusive-OR gate 616 is changed from high to low. Under such condition, the potential of the outputs delivered from all the Exclusive-OR gates 616, 616 . . . becomes low. As described above, the output 6170 delivered from the NOR gate 617 causes the toggle flipflop 610 to reset. In this case, in order to change over the potential of the output $Q_4$ from low to high, provision must be made of one pulse of the reference signal. Under such condition, it is possible to adjust the frequency of $(\pm 1)$ pulse.

The frequency adjusting values under various conditions at the input terminals $S_2$ to $S_8$ are shown in the following Table 1.

TABLE 1

| Input Terminals | Conditions of Input Terminals: Connected to Time Piece Substrate | Open |
|---|---|---|
| $S_8$ | ± 0 | ± 1 |
| $S_7$ | ± 0 | ± 2 |
| $S_6$ | ± 0 | ± 4 |
| $S_5$ | ± 0 | ± 8 |
| $S_4$ | ± 0 | ± 16 |
| $S_3$ | ± 0 | ± 32 |
| $S_2$ | ± 0 | ± 64 |
| Minimum | ± 0 | |
| Maximum | ± 127 | |

As seen in the above Table 1, it is possible to adjust the frequency of pulses within a range between the minimum (±0) and the maximum (±127) depending on the conditions at the input terminals $S_2$ to $S_8$. In addition, if input terminals $S_9$, $S_{10}$... are added, the number of pulses whose frequency is to be adjusted can be increased 2 times in succession.

The operation of addition and subtraction of the frequency adjustment will now be described. Under an initial condition, let the potential of the output $Q_2$ of the D type flipflop 609 be low, the potential of the output $Q_3$ of the toggle flipflop 610 be low and let the potential of the output $\overline{Q}_3$ of the toggle flipflop 610 be high. Since the potential of the output $Q_3$ of the toggle flipflop 610 is low, the potential of both outputs 6040, 6050 delivered from NAND gates 604, 605 becomes high. Since the potential of the output 6040 delivered from the NAND gate 604 is high, the potential of the output $Q_1$ of the toggle flipflop 602 becomes low and is applied to one of inputs of an Exclusive-OR gate 601. To the other input of the Exclusive-OR gate 601 is applied the reference signal 51, so that an output $\phi_b$ delivered from the Exclusive-OR gate 601 becomes substantially in phase with the reference signal 51 and is applied to one of input terminals of an AND gate 607. To the other input of the AND gate 607 is applied the output 6050 delivered from the NAND gate 605. The potential of the output 6050 is high, so that the AND gate 607 functions to deliver as its output a frequency adjusted signal 61 which is substantially in phase with the reference signal 51.

Under such condition, in order to effect the subtraction operation, the input terminal $S_1$ is opened. As a result, the potential of the output delivered from the inverter 612 becomes high. This high potential output delivered from the inverter 612 is applied to the other input of the NAND gate 605 and to the input of the inverter 603. As a result, the potential of the output delivered from the inverter 603 becomes low and this low potential output delivered from the inverter 603 is applied to the other input of the NAND gate 604.

If the potential of the frequency adjusting instruction signal 71 applied to the input D of the D type flipflop 609 is changed from low to high, the potential of the output $Q_3$ of the toggle flipflop 610 becomes high and the potential of the output $\overline{Q}_3$ thereof becomes low, thereby starting the frequency adjusting operation.

Under such condition, since the potential of the output of the inverter 603 is low, the potential of the output 6040 delivered from the NAND gate 604 is maintained at high as ever. The potential of both the inputs of the NAND gate 605 are high, the potential of the output 6050 delivered from the NAND gate 605 becomes low to close the NAND gate 607, thereby making the frequency adjusted signal low. This condition is continued until the toggle flipflop 610 is reset by the output 6170 delivered from the NOR gate 617, that is, until the frequency divider 611 functions to count the pulses corresponding to the frequency adjusting values determined by the input terminals $S_1$ to $S_8$. During this time, the potential of the frequency adjusted signal 61 delivered from the AND gate 607 is maintained at low. If the frequency divider 611 terminates its counting operation and the output 6170 delivered from the NOR gate 617 causes the toggle flip-flop 610 to reset, the potential of the output 6050 delivered from the NAND gate 605 becomes high again, and as a result, the AND gate 607 functions to deliver as its output the frequency adjusted signal 61 which is substantially in phase with the reference signal 51, thereby completing the subtraction operation.

The addition operation will now be described. In the case of the addition, the input terminal $S_1$ is connected to the time piece substrate. This causes the potential of the output delivered from the inverter 612 to make low. This low potential output is applied to the other input of the NAND gate 605 and to the input of the inverter 603. The potential of the output delivered from the inverter 603 becomes high and this high potential output is applied to the other input of the NAND gate 604. Under the initial condition, the potential of the output $Q_2$ of the toggle flipflop 610 is low, while the potential of the output $\overline{Q}_3$ thereof is high. This low potential output $Q_3$ of the flipflop 610 is applied to the other input terminals of the NAND gates 604 and 605, respectively, so that the potential of both the outputs 6040 and 6050 delivered to the NAND gates 604 and 605 becomes high, respectively. Such condition is the same as that condition under which the frequency is not adjusted as already described with reference to the subtraction.

If the potential of the frequency adjusting instruction signal 71 is changed from low to high, the potential of the output $Q_3$ of the toggle flipflop 610 becomes high and the potential of the output $\overline{Q}_3$ thereof becomes low, thereby starting the frequency adjusting operation. Under such condition, the potential of the output of the inverter 612 is low, the potential of the output 6050 delivered from the NAND gate 605 is maintained at high as ever. Both the potential of the output of the inverter 603 and the potential of the output $Q_3$ of the toggle flipflop 610 are high, so that the potential of the output 6040 delivered from the NAND gate 604 becomes low, thereby releasing the toggle flipflop 602 from its reset condition. At this time, the potential of the output $Q_1$ of the toggle flipflop 602 is low, so that the reference signal 51 applied to the Exclusive-OR gate 601 causes the potential of the signal $\phi_b$ to change from low to high when the potential of the reference signal 51 is changed from low to high. As a result, the toggle flipflop 602 becomes triggered to make the potential of the output $Q_1$ high. If the potential of the output $Q_1$ is high, the potential of the output $\phi_b$ of the Exclusive-OR gate 601 is immediately changed from high to low.

If the potential of the reference signal 51 is changed from high to low, the potential of the output $\phi_b$ delivered from the Exclusive-OR gate 601 is changed again from low to high, and as a result, the toggle flipflop 602 is triggered to make the potential of the output $Q_1$ low.

If the potential of the output $Q_1$ becomes low, the potential of the output $\phi_b$ delivered from the Exclusive-OR gate 601 is immediately changed from high to low. That is, when the reference signal 51 is raised or lowered, the toggle flipflop 602 is alternately operated. At this time, the signal $\phi_b$ becomes a differential pulse whose frequency is multiplied by two times the reference signal 51 by means of a multiplier circuit consisting of the Exclusive-OR gate 601 and the toggle flipflop 602. This signal $\phi_b$ is applied to one of the inputs of the AND gate 607. To the other input of the AND gate 607 is applied the output 6050 delivered from the NAND gate 605. Since the potential of the output 6050 is high, the output 61 delivered from the AND gate 607 becomes a signal which is substantially in phase with the signal $\phi_b$.

As described with respect to the subtraction, this condition is continued until the toggle flipflop 610 is reset by the output 6170 delivered from the NOR gate 617. During this time, the frequency of the output 61 delivered from the AND gate 607 becomes twice as high as before. That is, the number of pulses of the frequency adjusted value determined at the input terminals $S_2$ to $S_8$ is added thereto.

FIG. 4 is a timing chart of the frequency adjusting circuit shown in FIG. 3, separately showing the addition and the subtraction. Both the addition and the subtraction are to the number of pulses of (±5) at the input terminals.

The conventional frequency adjusting circuit has the drawback that in the case of measuring pitches every one second, for example, if the frequency adjusting value is large, the pitch changes each second, thereby rendering the measurement difficult.

The invention provides a way of effecting the frequency adjustment at the same time, and can easily measure the pitch. In addition, the frequency adjusting circuit according to the invention can be incorporated into any time piece circuit in a simple and highly precise manner so as to precisely adjust the frequency of the time reference signal.

What is claimed is:

1. A circuit digitally adjusting the frequency of a time reference signal comprising:

means for generating an unadjusted time reference signal;

means for adjusting the mean frequency of the time reference signal by adding a desired number of pulses to, or by subtracting a desired number of pulses from, said time reference signal;

a frequency divider for generating an adjusted output frequency and a frequency adjusting instruction signal which initiates adjustment of the mean unadjusted frequency of the time reference signal by dividing the frequency of the output of the frequency adjusting means;

a setting means for determining the time of effecting the frequency adjusting operation of the frequency adjusting means upon receipt of the frequency adjusting instruction signal.

2. The circuit as defined in claim 1 wherein the frequency adjusting means includes a frequency doubler circuit for doubling the frequency of the time reference signal.

3. The circuit as defined in claim 1 wherein the frequency adjusting means includes a second frequency divider which operates to start to count the pulses of the time reference signal pulse train in response to the frequency adjusting instruction signal and to stop counting when the counted number of pulses becomes equal to a number which is set in the setting means.

4. A circuit for digitally adjusting the frequency of a time reference signal pulse train comprising:

means for generating an unadjusted time reference signal;

means for adjusting the main frequency of the time reference signal by adding a desired number of pulses to, or by subtracting a desired number of pulses from, the time reference signal;

a frequency divider for generating an adjusted output frequency and a frequency adjusting instruction signal which initiates adjustment of the unadjusted frequency of the time reference signal by dividing the frequency of the output of the frequency adjusting means;

a first setting means for determining the time of effecting the frequency adjusting operation of the frequency adjusting means upon receipt of the frequency adjusting signal;

a second setting means to operate to add a pulse or pulses to, or to subtract a pulse or pulses from, the time reference signal.

5. The circuit as defined in claim 4 wherein the frequency adjusting means includes a frequency doubler circuit for doubling the frequency of the time reference signal.

6. The circuit as defined in claim 4 wherein the frequency adjusting means includes a second frequency divider which operates to start to count the pulses of the time reference signal in response to the frequency adjusting instruction signal and to stop counting the pulses when the counted number of pulses becomes equal to a number set in the first setting means.

7. A circuit for digitally adjusting the frequency of a time reference signal pulse train comprising:

a. a time reference signal source generating an unadjusted time reference signal;

b. a frequency adjusting means having an addition or subtraction circuit for adding or subtracting a number of pulses in accordance with an amount of frequency to be adjusted;

c. an externally actuated means for controlling the amount of frequency to be adjusted by setting the amount of frequency to be added or subtracted;

d. a frequency divider circuit for dividing signals adjusted by the frequency adjusting means; whereby a defined signal from the frequency divider circuit is applied to the frequency adjusting means and thereby determines the start timing of the frequency adjusting means.

8. The circuit as defined in claim 7 wherein the addition and subtraction circuit of the frequency adjusting means comprises a frequency doubler circuit for doubling the frequency of the time reference signal and a circuit for eliminating the time reference signal upon subtraction.

9. A circuit for digitally adjusting the frequency of a time reference signal comprising:

means for generating the time reference signal;

means for adjusting the mean frequency of the time reference signal by adding a pulse or pulses to, or by subtracting a pulse or pulses from, the time reference signal;

a frequency divider for generating a frequency adjusting instruction signal which initiates adjustment of the mean frequency of the time reference signal by dividing the frequency of the output of the frequency adjusting means;

a setting means for determining the time of effecting the frequency adjusting operation of the frequency adjusting means upon receipt of the frequency adjusting instruction signal; wherein the frequency adjusting means includes a frequency doubler circuit for doubling the frequency of the time reference signal; and the frequency doubler circuit includes an Exclusive-OR gate and a toggle flip-flop, the Exclusive-OR gate having a frist input terminal supplied with the time reference signal as its input, a second input terminal connected to the output terminal of the toggle flip-flop, and an output terminal connected to the clock input of the toggle flip-flop.

10. A circuit for digitally adjusting the frequency of a time reference signal pulse train comprising:

means for generating the time reference signal;

means for adjusting the means frequency of the time reference signal by adding a pulse or pulses to, or by subtracting a pulse or pulses from, the time reference signal;

a frequency divider for generating a frequency adjusting instruction signal which initiates adjustment of the frequency of the time reference signal by dividing the frequency of the output of the frequency adjusting means;

a first setting means for determining the time of effecting the frequency adjusting operation of the frequency adjusting means upon receipt of the frequency adjusting signal;

a second setting means for setting the frequency adjusting means to operate to add a pulse or pulses to, or subtract a pulse or pulses from, the time reference signal;

wherein the frequency adjusting means includes a frequency doubler circuit for doubling the frequency of the time reference signal; and the frequency doubler circuit includes an Exclusive-OR gate and a toggle flip-flop, the Exclusive-OR gate having a first input terminal supplied with the time reference signal as its input, a second input terminal connected to the output of the toggle flip-flop, and an output terminal connected to the clock input of the toggle flip-flop.

* * * * *